(12) United States Patent
Nishitsuji et al.

(10) Patent No.: US 11,973,097 B2
(45) Date of Patent: Apr. 30, 2024

(54) LIGHT SHIELDING MEMBER, LENS UNIT, CAMERA MODULE, AND ELECTRONIC DEVICE

(71) Applicant: TOPPAN INC., Tokyo (JP)

(72) Inventors: Kiyoaki Nishitsuji, Tokyo (JP);
Shinichi Shimamura, Tokyo (JP);
Hiroyasu Aizawa, Tokyo (JP)

(73) Assignee: TOPPAN INC., Tokyo (JP)

( * ) Notice: Subject to any disclaimer, the term of this patent is extended or adjusted under 35 U.S.C. 154(b) by 207 days.

(21) Appl. No.: 17/573,901

(22) Filed: Jan. 12, 2022

(65) Prior Publication Data

US 2022/0139986 A1     May 5, 2022

Related U.S. Application Data

(63) Continuation of application No. PCT/JP2020/027895, filed on Jul. 17, 2020.

(30) Foreign Application Priority Data

| Jul. 19, 2019 | (JP) | 2019-133739 |
| Jul. 19, 2019 | (JP) | 2019-133740 |
| Sep. 13, 2019 | (JP) | 2019-167046 |
| Sep. 13, 2019 | (JP) | 2019-167047 |

(51) Int. Cl.
*H01L 27/146* (2006.01)

(52) U.S. Cl.
CPC .. *H01L 27/14623* (2013.01); *H01L 27/14625* (2013.01)

(58) Field of Classification Search
CPC ......... H01L 27/14623; H01L 27/14625; H01L 27/14618; G02B 5/00; G02B 7/02; G03B 9/02; G03B 7/02; G03B 17/12; C23F 1/00; H04N 23/54; H04N 23/55
See application file for complete search history.

(56) References Cited

U.S. PATENT DOCUMENTS

| 10,656,370 B2 * | 5/2020 | Wan | G02B 7/026 |
| 11,237,361 B2 * | 2/2022 | Chou | G02B 7/021 |

(Continued)

FOREIGN PATENT DOCUMENTS

| JP | 2017-015815 A | 1/2017 |
| JP | 2020-030387 A | 2/2020 |

(Continued)

OTHER PUBLICATIONS

Office Action issued in connection with Taiwan Appl. No. 111129289 dated May 24, 2023.

(Continued)

*Primary Examiner* — Shahbaz Nazrul
(74) *Attorney, Agent, or Firm* — Foley & Lardner LLP (57) ABSTRACT

A light shielding member formed of an annular metal base material includes a front surface, a rear surface facing away from the front surface, and an outer peripheral surface connecting the front and rear surfaces in an outer periphery of the light shielding member. The outer peripheral surface includes a ridge that is protruded outward furthest therein in a radial direction of the light shielding member, in a cross section that is parallel to a plane perpendicular to the front surface.

10 Claims, 6 Drawing Sheets

(56) References Cited

U.S. PATENT DOCUMENTS

| | | | |
|---|---|---|---|
| 2007/0098400 A1* | 5/2007 | Chen .................... | G02B 13/001 396/529 |
| 2014/0160581 A1* | 6/2014 | Cho ................... | G02B 13/0035 359/738 |
| 2016/0161702 A1* | 6/2016 | Yang ...................... | G02B 7/028 359/503 |
| 2017/0322394 A1* | 11/2017 | Chou ................. | G02B 13/0055 |
| 2019/0187340 A1* | 6/2019 | Jheng ....................... | G02B 7/02 |
| 2020/0057235 A1* | 2/2020 | Wang .................... | G02B 7/021 |
| 2022/0043325 A1* | 2/2022 | Huang .................... | G02B 7/20 |

FOREIGN PATENT DOCUMENTS

| | | |
|---|---|---|
| JP | 2020-140130 A | 9/2020 |
| TW | I451182 B | 9/2014 |

OTHER PUBLICATIONS

International Searching Authority, "International Search Report," issued in connection with International Patent Application No. PCT/JP2020/027895, dated Oct. 13, 2020, 5 pages.

International Searching Authority, "Written Opinion," issued in connection with International Patent Application No. PCT/JP2020/027895, dated Oct. 13, 2020, 4 pages.

* cited by examiner

$t_{out} > t_{in}$

FIG.9

LIGHT SHIELDING MEMBER, LENS UNIT, CAMERA MODULE, AND ELECTRONIC DEVICE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/027895, filed on Jul. 17, 2020, which is based upon and claims the benefit of priority to Japanese Patent Application No. 2019-133739, filed on Jul. 19, 2019; Japanese Patent Application No. 2019-133740, filed on Jul. 19, 2019; Japanese Patent Application No. 2019-167046, filed on Sep. 13, 2019 and Japanese Patent Application No. 2019-167047, filed on Sep. 13, 2019; the disclosures of which are incorporated herein by reference in their entireties.

BACKGROUND

Technical Field

The present invention relates to light shielding members, lens units, camera modules, and electronic devices.

Optical devices, such as cameras, and camera modules installed in electronic devices and the like, such as mobile information terminal devices and personal computers, include a lens unit in which a plurality of lenses stacked in a lens holder, i.e., a lens barrel, are combined with a solid-state image sensor. Solid-state image sensors are image sensors serving as, for example, CCDs, CMOSs, and the like. In such a lens unit, light shielding members for light shielding and for defining apertures are used between the lenses. Apertures are openings defining a diaphragm.

There is a technique disclosed regarding a light shielding member which is produced using a metal base material, such as aluminum (Al), copper (Cu), tin (Sn) or SUS (stainless steel), to impart excellent light shielding performance thereto (e.g., see PTL 1). PTL 1 discloses forming a plurality of cone-shaped protrusions having a predetermined size which are arrayed at a predetermined pitch and in a predetermined orientation on the surface of a light shielding member, i.e., discloses forming a moth-eye structure, to achieve a more reliable light shielding performance. Such light shielding members prevent entry of stray light and occurrence of flare and ghosting in the lens unit of a camera module, by which the light that is harmful to imaging is blocked to improve the imaging performance of the camera module.
[Citation List] [Patent Literature] [PTL 1] JP 2017-15815 A.

SUMMARY OF THE INVENTION

Technical Problem

When producing light shielding members using a metal base material having a predetermined thickness, strain and/or wrinkling may occur in the products in the process of punching. Also, in the process of cutting, portions having a metallic gloss may be exposed at the cut surface depending on the cutting process. Therefore, these processes may both cause deterioration in light shielding performance. In particular, these two processes may greatly deteriorate light shielding performance of the processed surfaces of the apertures which have a great influence on the imaging performance.

As a method of producing light shielding members using a metal base material, photoetching may be used. Isotropic photoetching involves side etching in a direction perpendicular to the direction in which etching progresses, and therefore it is difficult to form a through hole perpendicularly to the metal base material having a predetermined thickness, using this method. However, the cross-sectional configuration of the processed portion can be controlled by combining photoetching from the front surface of the metal base material with photoetching from the rear surface thereof to positively apply side etching.

The processed surface of the aperture for eliminating flare and ghosting and the processed surface defining the profile of the light shielding member respectively have suitable cross-sectional configurations. If isotropic photoetching from the front surface of the metal base material is combined with isotropic photoetching from the rear surface thereof, the etching processes respectively progress forming substantially arc shapes toward the inside of the metal base material. Accordingly, this combined etching forms an edge, i.e., a ridge, which is an etching intersection, as viewed perpendicularly to the cross section, at the penetration meeting point where the arcs etched from the front and rear surfaces intersect.

The present invention aims to propose an annular light shielding member having an outer peripheral cross-sectional configuration that has good handleability in the process of assembling a lens unit, by forming a through hole using photoetching that forms an inner diameter defining an aperture as an inner periphery of the light shielding member and an outer diameter defining a profile as an outer periphery of the light shielding member.

Solution to Problem

A light shielding member for solving the above issues is a light shielding member formed of an annular metal base material. The light shielding member includes a front surface, a rear surface facing away from the rear surface, and an outer peripheral surface connecting between the front surface and the rear surface in an outer periphery of the light shielding member. The outer peripheral surface includes a ridge that is protruded outward furthest therein in a radial direction of the light shielding member, in a cross section that is parallel to a plane perpendicular to the front surface.

In the light shielding member, the ridge may be located at a position deviated from a center portion of the metal base material in a thickness direction thereof.

In the light shielding member, external light may be incident on the front surface of the light shielding member; the light shielding member may include an opening penetrating the metal base material in a thickness direction thereof; the opening may be enclosed by an inner peripheral surface; and the inner peripheral surface may have a tapered shape in which an opening diameter in the front surface is larger than an opening diameter in the rear surface.

In the light shielding member, the ridge may be located at a position closer to the rear surface in the thickness direction of the metal base material.

In the light shielding member, when the light shielding member is imaged in the radial direction thereof by bringing the ridge into focus under an imaging condition of a depth of field being 0.4 μm, a portion having a first thickness including the ridge may be focused in the light shielding member in the thickness direction; when the light shielding member is imaged in the radial direction thereof by bringing an edge end of the opening into focus under the imaging condition of a depth of field being 0.4 µm, a portion having a second thickness including the edge end may be focused in the light shielding member in the thickness direction; and the first thickness may be larger than the second thickness.

In the light shielding member, a length by which the ridge protrudes outward in an in-plane direction of the light shielding member may be smaller than a length by which the edge end protrudes toward a center of the opening.

The metal base material may be any one material selected from the group consisting of aluminum, iron, copper, chromium, nickel, cobalt, and alloys of these materials.

The metal base material may be an iron-nickel alloy or an iron-nickel-cobalt alloy.

The metal base material may be Invar or Super Invar.

A lens unit for solving the above issues includes the above light shielding member, a plurality of lenses, and a lens holder.

A camera module for solving the above issues includes the above lens unit, and an image sensor.

An electronic device for solving the above issues includes the above camera module.

Advantageous Effects of the Invention

According to the present invention, there is provided a light shielding member having a cross-sectional configuration that can have good handleability in the process of assembling a lens unit.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

First Embodiment

Figure 4:
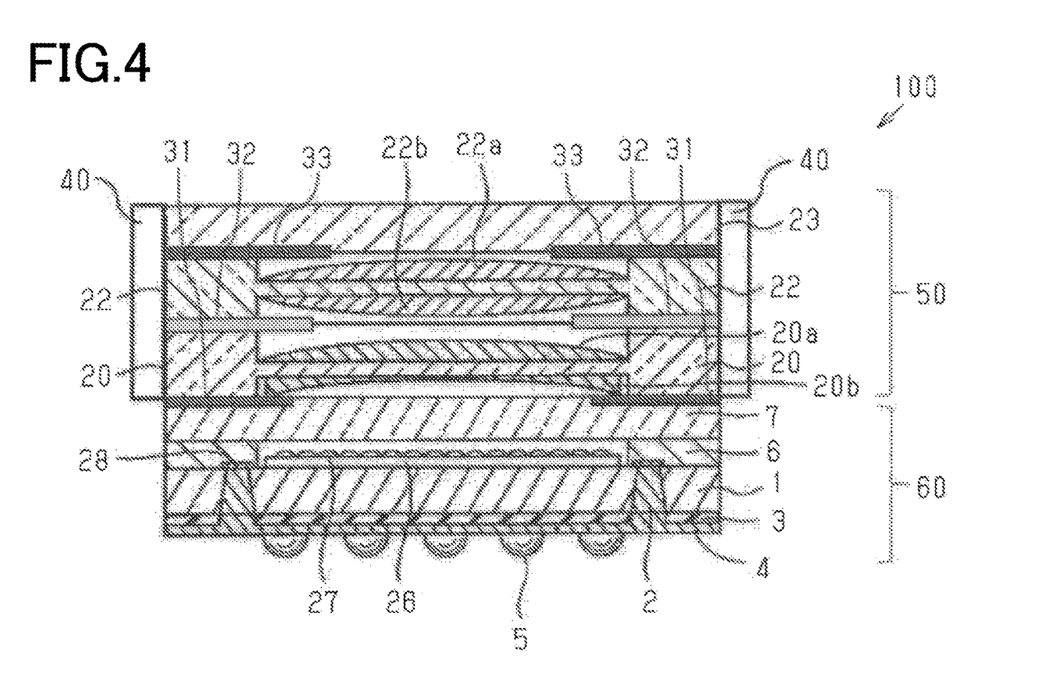
FIG. 4 is a cross-sectional view illustrating the structure of an example of a camera module including light shielding members.

FIG. 4 shows an example of a camera module 100. However, camera modules to which the light shielding member of the present disclosure can be applied are not limited to the camera module 100. The camera module 100 shown in FIG. 4 includes a lens unit 50, and an image pickup sensor (image sensor) 60. The camera module 100 may be incorporated in, for example, smartphones or mobile phones. The lens unit 50 includes a first lens sheet 20, a second lens sheet 22, light shielding members 31, 32 and 33, and a lens holder (lens barrel) 40. The lens holder 40 incorporates the lens sheets 20 and 22, and the light shielding members 31, 32 and 33.

In the example shown in FIG. 4, lenses 20a and 20b are formed on the front and the rear of the first lens sheet 20, while lenses 22a and 22b are formed on the front and the rear of the second lens sheet 22. It should be noted that the number of lens sheets is not limited to two. In other words, the number of lenses is not limited to four but may be increased or decreased according to the design of the lens unit 50. The light shielding members 31, 32 and 33 are annular sheets. The light shielding members 31, 32 and 33 are respectively disposed above the light-incident surface of the lens 22a, between the lenses 22b and 20a, and between the light-output surface of the lens 20b and a sealing glass plate 7 of the image pickup sensor 60. The light shielding members 31, 32 and 33 block light other than that required for imaging. The light shielding members 31, 32 and 33 have respective sizes and opening sizes suitable for their adjacent lenses. The opening sizes refer to the diameters of the opening of the light shielding members 31, 32 and 33.

The solid-state image pickup sensor includes a silicon substrate 1 having an upper surface serving as a light-receiving element surface on which color separation filters 26 and condenser microlenses 27 are formed for respective pixels. An electrical signal of image information retrieved by the solid-state image pickup sensor is guided to the rear surface of the silicon substrate 1 via aluminum electrodes 28 by an electrically conductive material 2 filled in a through silicon via (TSV) or covering the inner wall of the TSV. The electrical signal is guided to BGA connection terminals 5 by a patterned insulating layer 3 and a conductive layer 4 and inputted to an external circuit from the connection terminals 5. The sealing glass plate 7 is located above the silicon substrate 1 via a frame wall 6. With the glass plate 7 being bonded to the frame wall 6, airtightness can be imparted to the light-receiving region. The frame wall 6 is thin and has a thickness of about 50 The camera module 100 has an uppermost portion where a cover glass plate 23 is disposed.

Figure 3:
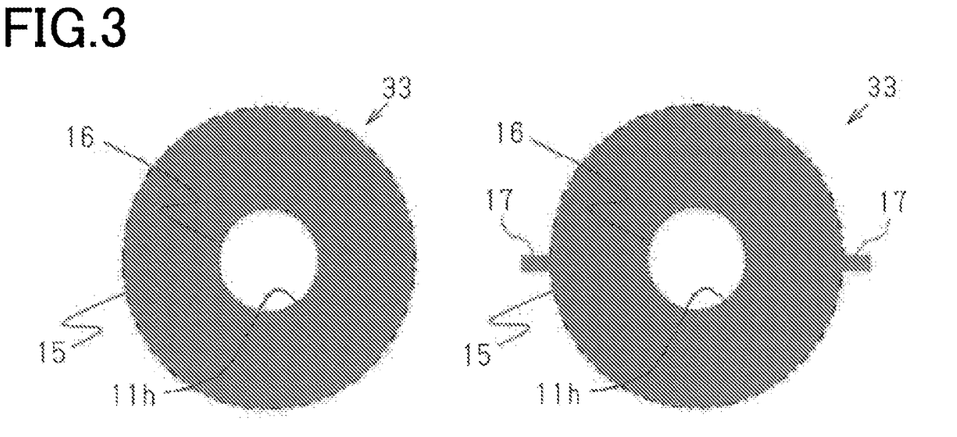
FIG. 3 is a set of diagrams each being a plan view illustrating the structure of the light shielding member shown in FIG. 1(a) and FIG. 1(b).

Hereinafter, a first embodiment of the light shielding members 31, 32 and 33 will be described. As shown in the plan views of FIG. 3, a light shielding member is a sheet formed into a substantially annular shape. The differences in shape between the light shielding members shown in FIGS. 3(*a*) and 3(*b*) will be described later. The light shielding members 31, 32 and 33 have the same configuration except the outer diameter, inner diameter and thickness, and therefore, the light shielding member 33 will be described in detail, omitting description for the light shielding members 31 and 32.

Any of punching, laser processing and etching can be used for producing the light shielding member 33, but in the present disclosure, etching is used to process a processed surface into a suitable configuration.

As a metal base material for forming the light shielding member 33, a stainless steel base material having a thickness of 10 μm or more and 100 μm or less is preferred. Stainless steel may be represented by, for example, SUS304. Stainless steel is an alloy containing chromium, or containing chromium and nickel, and also containing iron as a main component.

If the thickness of the light shielding member 33 is 10 μm or more, the shape of the light shielding member 33 may be prevented from being affected by warpage of the metal base material. If the thickness of the light shielding member 33 is 100 μm or less, the accuracy of etching when forming an opening may be prevented from being lowered. It should be noted that the light shielding member 33 may be formed of metal other than stainless steel. In this case, the light shielding performance of the light shielding member made of metal other than stainless steel only has to be the same as that of the light shielding member made of stainless steel.

The other metal forming a metal base material may be any one material selected from the group consisting of aluminum, iron, copper, chromium, nickel, cobalt, and alloys of these materials. From the perspective of applying various surface treatments, such as black plating and roughening, to the metal base material or from the perspective of improving characteristics, such as strength, the other metal is preferred to be aluminum. Aluminum is excellent in that it can be easily processed and handled.

Alloys as materials other than stainless steel forming the metal base material may include iron-nickel alloys and iron-nickel-cobalt alloys. Iron-nickel alloys have thermal expansion coefficients smaller than that of stainless steel. Therefore, light shielding members made of iron-nickel alloys are less likely to be deformed due to changes in outside temperature and can minimize the occurrence of warpage in the light shielding members. Furthermore, light shielding members made of iron-nickel alloys can minimize variation in the amount of incident external light due to warpage occurring therein or due to changes in inner diameter that is due to thermal expansion or contraction, which would otherwise have been caused by changes in outside temperature. It should be noted that the amount of incident external light refers to an amount of external light incident on the lens via the light shielding member. Therefore, forming light shielding members with iron-nickel alloys is advantageous for reducing or preventing ghosting and flare that would be caused by variation in the amount of incident external light.

It should be noted that the iron-nickel alloys refer to alloys containing iron and nickel as main components, e.g., containing 30 mass % or more nickel, and iron as the remainder. Of the iron-nickel alloys, an alloy containing 36 mass % nickel, i.e., Invar, is preferred as a material for forming light shielding members. In Invar, the remainder except for the 36 mass % nickel may contain additives other than iron as a main component. The additives may be, for example, chromium, manganese, carbon and cobalt. The maximum amount of additives contained in the iron-nickel alloys is 1 mass % or less.

Iron-nickel-cobalt alloys have thermal expansion coefficients smaller than those of iron-nickel alloys. Therefore, light shielding members made of iron-nickel-cobalt alloys can further reduce deformation due to changes in outside temperature and can further reduce the occurrence of warpage in the light shielding members. Furthermore, light shielding members made of iron-nickel-cobalt alloys can further reduce variation in the amount of incident external light due to warpage occurring therein or due to changes in inner diameter that is due to thermal expansion or contraction, which would otherwise have been caused by changes in outside temperature. Therefore, forming light shielding members with iron-nickel-cobalt alloys is more advantageous for reducing or preventing ghosting and flare that would be caused by variation in the amount of incident external light.

It should be noted that the iron-nickel-cobalt alloys refer to alloys containing iron, nickel and cobalt as main components, e.g., containing 30 mass % or more nickel, 3 mass % or more cobalt, and iron as the remainder. Of the iron-nickel-cobalt alloys, an alloy containing 32 mass % nickel and 4 mass % or more and 5 mass % or less cobalt, i.e., Super Invar, is preferred as a material for forming light shielding members. In Super Invar, the remainder except for the 32 mass % nickel and 4 mass % or more and 5 mass % or less cobalt may contain additives other than iron as a main component. These other additives may be, for example, chromium, manganese and carbon. The maximum amount of these other additives contained in the iron-nickel-cobalt alloys may be 0.5 mass % or less.

The alloy forming the metal base material may be stainless steel Invar. The content of nickel and cobalt in stainless steel Invar is higher than that in Super Invar, and stainless steel Invar contains chromium. The thermal expansion coefficient of stainless steel Invar is much smaller than that of Super Invar. The following description will be given focusing on use of a stainless steel base material.

The light shielding member 33 can be obtained using photolithography. In photolithography, a resist pattern is formed for use as a mask on a major surface of a plate-shaped stainless steel base material. Using the mask, the stainless steel base material is etched from one major surface, i.e., the front surface, using an etchant that is capable of etching stainless steel base materials. After that, the stainless steel base material is etched from the other major surface, i.e., the rear surface, so that a light shielding member 33 having a desired shape can be cut out of, i.e., separated from, the stainless steel base material. As will be described later, the stainless steel base material may be etched from the rear surface first, followed by etching from the front surface.

Figure 1A:
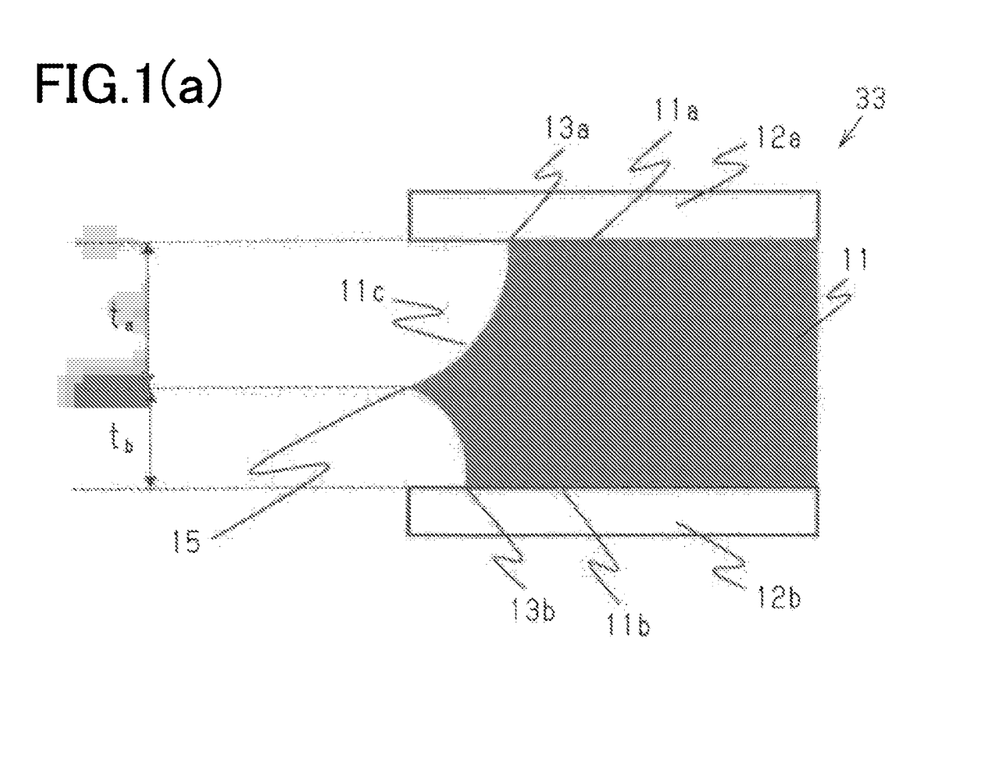
FIG. 1(a) and FIG. 1(b) are a set of diagrams each being a partial enlarged cross-sectional view illustrating a light shielding member according to a first embodiment.
Figure 1B:
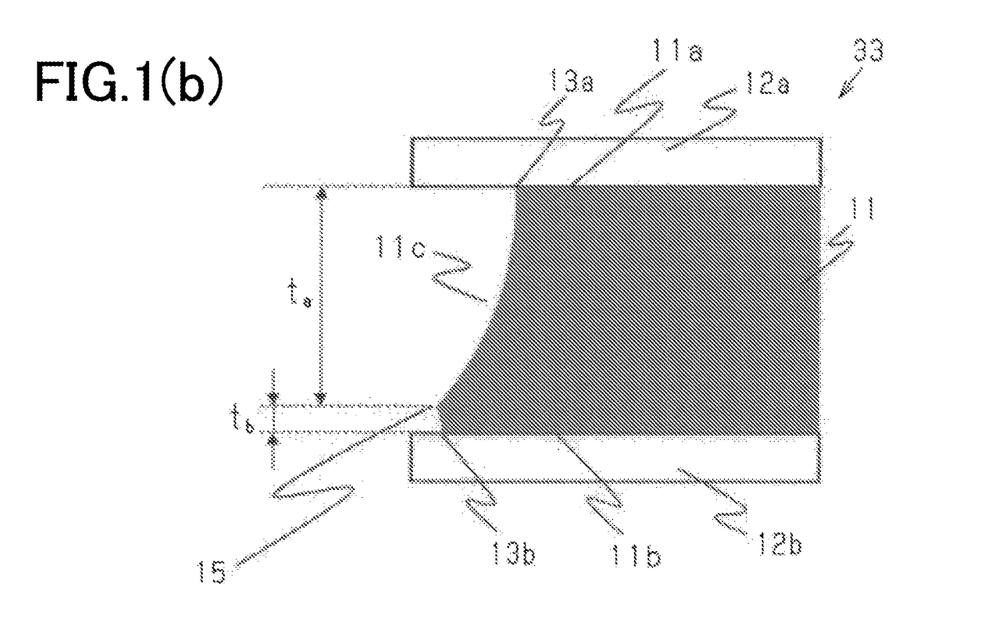

FIG. 1(a) and FIG. 1(b) are a set of diagrams each being an enlarged view illustrating a part of the light shielding member 33 obtained by etching and cutting a stainless steel base material 11 into a desired shape. It should be noted that the diagrams of FIG. 1(a) and FIG. 1(b) shows enlarged cross-sectional structures of the outer peripheries indicated by dash-dot lines in FIG. 3 and designated by a reference sign 15. Each light shielding member 33 shown in FIG. 1(a) and FIG. 1(b) includes two major surfaces 11a and 11b facing away from each other, and an end surface (outer peripheral surface) 11c. The major surfaces 11a and 11b of the stainless steel base material 11 are provided with respective resist patterns 12a and 12b, and the stainless steel base material 11 is etched using the resist patterns 12a and 12b as masks. Thus, a ridge 15 is formed on the end surface 11c by etching isotropically progressed from both major surfaces 11a and 11b of the stainless steel base material 11 facing away from each other, i.e., by the etching from the major surface 11a (front surface) and the etching from the major surface 11b (rear surface).

In these etching processes, etching progresses in substantially arc shapes from the major surfaces 11a and 11b toward the inner portion of the stainless steel base material 11 as viewed perpendicularly to the cross section. Accordingly, when the stainless steel base material 11 is cut out, the end surface 11c has a configuration in which the arcs intersect each other in the vicinity of the center portion of the stainless steel base material 11 in the thickness direction thereof. As shown in FIG. 1(a), the ridge 15 is a portion protruding furthest in the end surface 11c. At the interfaces of the major surfaces 11a and 11b with the respective resist patterns 12a and 12b, portions where side etching progress are ends. The ends correspond to edges of the major surfaces 11a and 11b of the light shielding member 33 after separating the resist patterns 12a and 12b. Of the ends, the end located at the front surface 11a is a front end 13a, while the end located at the rear surface 11b is a rear end 13b.

Figure 5A:
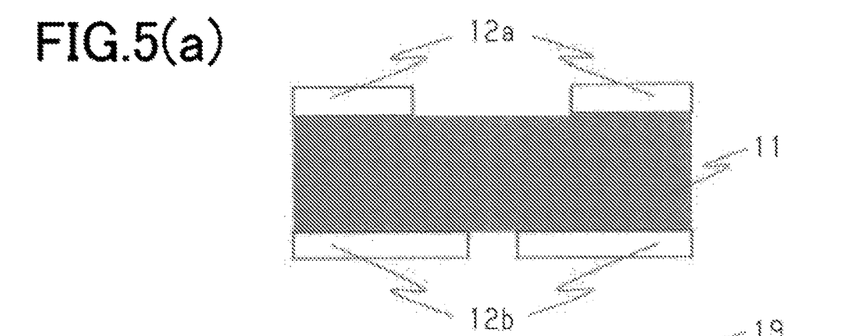
FIGS. 5(a)-5(e) are a set of diagrams illustrating an example of an etching procedure.
Figure 5B:
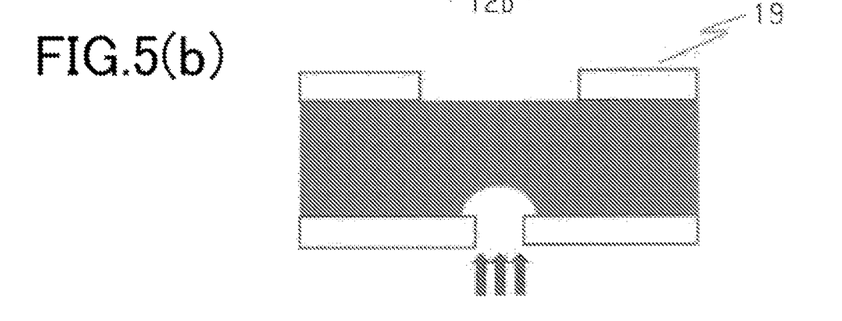
Figure 5C:
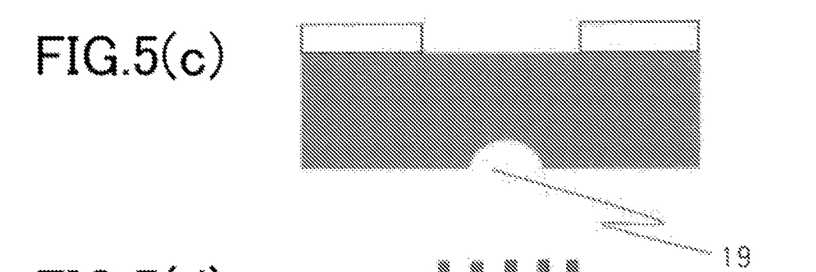
Figure 5D:
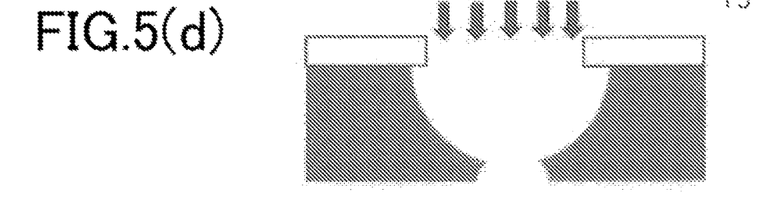
Figure 5E:
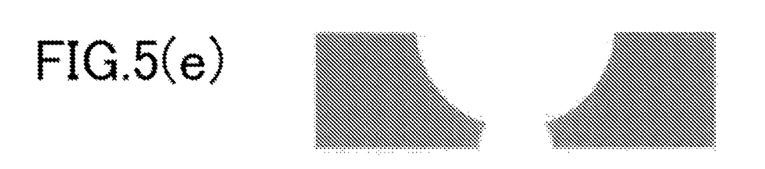

An example of etching is shown in FIG. 5(a)-FIG. 5(e). It should be noted that FIG. 5(a) illustrates only one through hole, omitting cross section for convenience's sake due to illustration limitation. After etching one major surface 11b of the stainless steel base material 11 halfway (FIG. 5(b)), etching is stopped temporarily. Then, etching resistant varnish 19 is filled in the etched recess (FIG. 5 (c)), followed by etching the stainless steel base material 11 again from the other major surface 11a until the etching resistant varnish 19 is reached (FIG. 5(d)), thereby forming a through hole in the stainless steel base material 11 (FIG. 5(e)). After the etching of the front surface has reached the etching resistant varnish 19, supply of the etchant to the stainless steel base material 11 is limited by the etching resistant varnish 19. Thus, the stainless steel base material 11 can have a cross-sectional configuration having high accuracy in a wide range of 10 μm or more and 100 μm or less.

According to the above method, excessive side etching can be reduced and a fine opening can be formed while accurately controlling the dimension thereof. Thus, the cross-sectional configuration of the end surface subjected to etching can also be controlled. In FIG. 5(a), the opening diameter of the resist pattern 12a is formed so as to be larger than that of the resist pattern 12b. In the above two-stage etching, formation of a first opening, i.e., a smaller opening, is followed by formation of a second opening, i.e., a larger opening. However, the order of etching is not limited to this. For example, resist patterns 12a and 12b having the same opening diameter may be formed in advance, followed by two-stage etching in which the etching time and the etchant spraying method may be changed or may be made different between the stages to control the cross-sectional configuration of the end surface of the opening etched.

FIG. 1(a) shows a cross-sectional configuration in which the ridge 15 is located at a position that is slightly displaced downward from the center portion in the thickness direction of the stainless steel base material 11. FIG. 1(b) shows a cross-sectional configuration in which the ridge 15 is located at a position that is greatly displaced downward from the center portion in the thickness direction of the stainless steel base material 11. In other words, the ridge 15 is deviated from the center portion in the thickness direction of the stainless steel base material 11. The ridge 15 is located closer to the rear surface 11b in the thickness direction of the stainless steel base material 11.

In FIG. 1(a), a thickness ta of the stainless steel base material 11 from the major surface 11a to the ridge 15 is substantially equal to a thickness tb thereof from the major surface 11b to the ridge 15. In contrast, in FIG. 1(b), the thickness ta is significantly larger than the thickness tb. The relationship between the thicknesses ta and tb is changed by changing the design of the resist patterns 12a and 12b in terms of opening diameter, or by controlling the etching time from the major surface 11a and the etching time from the major surface 11b, or by changing the combination of these parameters. Furthermore, using these methods, the ridge 15 can be changed in shape so as to have an acute angle.

Figure 2:
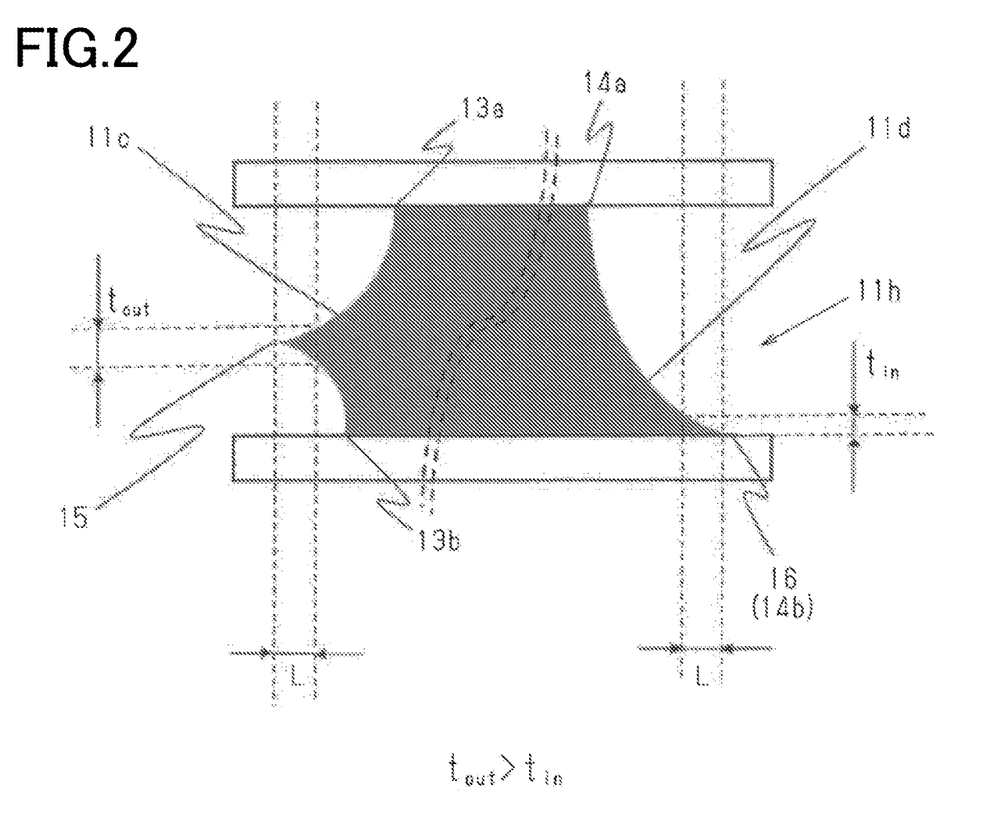
FIG. 2 is a cross-sectional view illustrating the inner periphery and the outer periphery of the light shielding member shown in FIG. 1(a) and FIG. 1(b) by bringing their end surfaces closer together.

FIG. 2 is a diagram illustrating an inner peripheral surface 11d and the outer peripheral surface 11c of the annular light shielding member 33. In FIG. 2, these end surfaces are illustrated so as to be close to each other for the sake of convenience of suitably comparing their cross-sectional configurations. The inner periphery of the light shielding member 33 corresponds to the dotted line as an outline of the opening shown in FIG. 3 in which the edge end 16 is continuous. The outer periphery of the light shielding member 33 corresponds to the dash-dot line as an outline of the ring shown in FIG. 3 in which the ridge 15 is continuous.

The opening (aperture) formed in the light shielding member 33 determines the diaphragm of each lens configuring the lens unit and directly influences the optical characteristics and the imaging performance of the lens unit. Therefore, the edge shape of the opening (aperture) is required to be exactly designed. Specifically, the edge end 16 in the inner peripheral surface 11d shown on the right side of FIG. 2 is required to prevent entry of reflected light, which is produced at the edge end 16, into the adjacent lens directly below in the lens unit and to eliminate the influence of noise light wrapping around between the edge end 16 and the lens. In the light shielding member 33, external light is incident on the front surface 11a. Therefore, the edge end 16 is required to have a shape in which the end (sharp end) has an acute angle in the portion (the lower major surface 11b) adjacent to the lens located directly below. Therefore, the opening 11h of the light shielding member 33 is preferred to have a diameter on the external-light-incident side larger than that on the opposite side. In other words, in the opening 11h of the light shielding member 33, the diameter in the front surface 11a is preferred to be larger than that in the rear surface 11b. The edge end 16 forms the opening 11h in the rear surface 11b of the light shielding member 33. It should be noted that, the opening 11h is defined by a front end 14a in the front surface 11a and defined by a rear end 14b in the rear surface 11b.

In contrast, the ridge 15 of the end surface (outer periphery) 11c shown on the left side of FIG. 2 has only a small influence on the optical characteristics and the imaging performance of the lens unit. The cross-sectional configuration of the ridge 15 is designed mainly from the perspective of handleability in the process of assembling the lens unit.

The lens unit 50 shown in FIG. 4 is formed by sequentially placing and laminating the light shielding member 31, the first lens sheet 20, the light shielding member 32, the second lens sheet 22, the light shielding member 33, and the cover glass plate 23 in the lens holder (lens barrel) 40. Alternatively, the lens unit 50 may be formed by covering the structure, which is a laminate of these components in the above order, with the lens barrel 40.

When handling the light shielding members 31, 32 and 33, these members are held by a jig (e.g., tweezers). It is necessary to prevent the jig from contacting the end surface (inner periphery) 11d shown in FIG. 2 serving as an inner wall of the opening 11h of the light shielding member 31, 32 or 33 and from contacting the edge end 16 thereof having a fine and sharp structure. Otherwise, the opening 11h and the edge end 16 would be damaged. Therefore, portions to be contacted by the jig in the light shielding member 33 should be on the end surface (outer periphery) 11c shown in FIG. 2. The light shielding member 31, 32 or 33 of the present embodiment can be easily held by a jig due to the presence of the ridge 15, compared to the case where the light shielding member 31, 32 or 33 has a flat outer peripheral surface 11c in a cross section perpendicular to the front surface 11a thereof. Accordingly, handleability of the light shielding member 31, 32 or 33 can be enhanced.

If the outer peripheral surface 11c has a ridge 15 and an adhesive agent is applied to the outer peripheral surface 11c, the adhesive agent can easily remain on the outer peripheral surface 11c compared to the case where the outer peripheral surface 11c is flat. From this perspective as well, the outer peripheral surface 11c having a ridge 15 can contribute to enhancing handleability of the light shielding member.

In order to secure mechanical strength in the light shielding member so as not to deform or damage it when it is held by a jig by bringing the jig into contact with two radially opposite ends of the ridge 15 in the circular outer periphery, the end of the ridge 15 may have a steep cylindrical surface with end surfaces (with reduced tapering) forming an angle near 90° as viewed in the figure, instead of an extremely sharp end. Specifically, the outer peripheral surface 11c including the ridge 15 may have a right triangular shape in a cross section perpendicular to the front surface 11a of the light shielding member 33. However, if the ridge 15 is located at an extremely low position as viewed in the figure, the contact portions with the jig may also be located at a low position. Therefore, the lens directly below the light shielding member 31, 32 or 33 may have a risk of coming into contact with the jig holding the light shielding member, in the process of assembling the lens unit. For this reason, the ridge 15 is preferred to be located at a position suitably away from the lower major surface 11b of the light shielding member 31, 32 or 33 in the thickness direction.

In terms of thickness of the light shielding member at a position away from the end of the ridge 15 by a predetermined distance L in the in-plane direction, the thickness tout of the ridge 15 (outer peripheral side) shown in FIG. 2 is required to be larger than the thickness tin of the edge end 16 (inner peripheral side). In the case of a light shielding member formed by shaping a stainless steel base material having a thickness of 10 μm to 100 μm, the thickness tout of the ridge 15 (outer peripheral side) is preferred to be 3.0 μm or more at the thinnest portion (portion where the light shielding member can be measured using a caliper or the like or where it can be held using a jig) as a substantial thickness. Furthermore, the thickness tb from the major surface 11b of the light shielding member to the ridge 15 shown in FIG. 1(a) and FIG. 1(b) is preferred not to be 0, i.e., preferred to be larger than 0.

In other words, the thickness tout of the ridge 15 and the thickness tin of the edge end 16 can be defined as follows. Specifically, when the light shielding member 33 is imaged in the radial direction thereof by bringing the ridge 15 into focus under an imaging condition of the depth of field being 0.4 μm, a portion having a first thickness including the ridge 15 will be in focus in the light shielding member 33 in the thickness direction thereof. This first thickness is the thickness tout of the ridge 15.

Furthermore, when the light shielding member 33 is imaged in the radial direction thereof by bringing the edge end 16 into focus under the same imaging condition, a portion having a second thickness including the edge end 16 will be in focus in the light shielding member 33 in the thickness direction thereof. This second thickness is the thickness tin of the edge end 16. The first thickness, i.e., the thickness tout of the ridge 15, is larger than the second thickness, i.e., the thickness tin of the edge end 16.

Since the thickness tout of the ridge 15 is larger than the thickness tin of the edge end 16 in the present embodiment, the mechanical strength of the ridge 15 to be held by a jig can be enhanced compared to the case where the thickness tout of the ridge 15 is equal to or smaller than the thickness tin of the edge end 16. Accordingly, the light shielding member 33 can be prevented from being deformed due to being held with a jig and, in addition, the light shielding member 33 can be easily held by a jig.

The angle of the ridge 15 is preferred to be larger than that of the edge end 16. The angles of the ridge 15 and the edge end 16 can be measured, for example, as follows. Specifically, the light shielding member 33 may be cut parallel to a plane perpendicular to the front surface 11a thereof to expose a cross section thereof. Subsequently, of the light shielding member 33, images of a part including the ridge 15 and a part including the edge end 16 may be captured. In this case, the part including the ridge 15 and the part including the edge end 16 may be imaged at the same magnification.

Subsequently, the two straight lines forming the ridge 15 may be marked on the image and the angle of the ridge 15 formed by the two straight lines may be measured. Also, the two straight lines forming the edge end 16 may be marked on the image and the angle of the edge end 16 formed by the two straight lines may be measured.

With the angle of the ridge 15 being larger than that of the edge end 16, mechanical strength of the ridge 15 can be enhanced compared to the case where the angle of the ridge 15 is equal to or smaller than that of the edge end 16. Thus, handleability of the light shielding member 33 can be enhanced when it is held with a jig.

Figure 7:
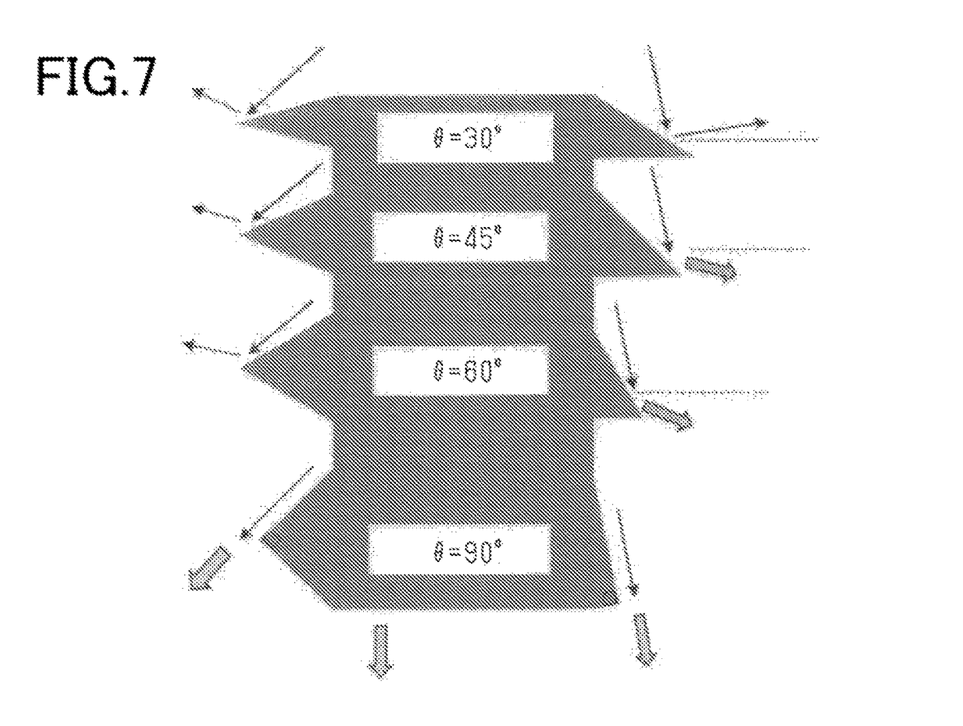
FIG. 7 is a schematic diagram illustrating optical characteristics of light shielding members according to design modifications.

To explain optical effects produced by the shapes of the ridge 15 and the edge end 16, FIG. 7 illustrates optical characteristics of light shielding members having outer and inner peripheral surfaces virtually provided with linear ridges, instead of end surfaces in each of which arcs intersect, i.e., end surfaces formed by etching. It should be noted that FIG. 7 shows four types of ridges and four types of edge ends. The ridges each have any of apex angles θ of 30°, 45°, 60° and 90°.

FIG. 7 shows, on the left side, the ridges having four types of apex angles. These ridges each protrude with the upper side and the lower side being at respective angles equal to each other. FIG. 7 shows, on the right side, ridges having four types of apex angles. These ridges each protrude with one side being parallel to the lower major surface 11b of the light shielding member. It should be noted that when the apex angle is 90°, neither of the sides forming the ridge is parallel to the lower major surface 11b.

On the left side of FIG. 7, when the apex angle θ is 90°, it is assumed that harmful light, which is not desired to be imaged but is incident on the ridge at 45° and travels leftward and down over the slope of the ridge, unavoidably travels further below the light shielding member as noise light. In each of the ridges having apex angles θ of 30°, 45° and 60°, harmful light, which is not desired to be imaged but is incident on the ridge at 45° and similarly travels leftward and down over the slope of the ridge, is reflected upward at the slope of the ridge and prevented from further traveling below the light shielding member.

On the right side of FIG. 7, it is assumed that harmful light, which is not desired to be imaged but is incident on the ridge at a little less than 90° and travels rightward and down over the slope (that forms a non-right angle to the lower major surface of the light shielding member) of the ridge having an apex angle θ of 90°, unavoidably further travels below the light shielding member as noise light. In each of the ridges having apex angles θ of 30°, 45° and 60°, harmful light, which is not desired to be imaged but is incident on the ridge at a little less than 90° and similarly travels rightward and down over the slope of the ridge, is reflected at the ridge. In this case, in each of the ridges having apex angles θ of 45° and 60°, light which is reflected at the ridge travels downward further than the auxiliary line (dotted line), and thus noise light traveling further below the light shielding member is not completely eliminated.

In the case of the lens unit shown in FIG. 4, harmful light produced outside the effective regions of the lenses 20a, 20b, 22a and 22b which is likely to be incident on the outer peripheral surfaces 11c of the light shielding members may be neglected. In contrast, harmful light produced inside the openings (apertures) of the light shielding members which is likely to be incident on the lenses and the image sensor is required to be eliminated as much as possible. Therefore, in addition to blackening treatment of the edge surfaces, the edge defining each opening (aperture) is required to have a shape in which the end (sharp end) has an acute angle, and the apex angle is preferred to be less than 45°.

If the light shielding member made of a stainless steel base material and having the cross-sectional and planar configurations described above is formed through etching, the light shielding member as formed may have sufficient optical density (OD). However, it may be necessary to reduce reflection of noise light components at portions having a metallic gloss and thus a known blackening treatment is applied to the light shielding member. The blackening treatment may be applied, for example, using an electroplating method using an electroplating solution containing nickel, an electroless plating method that is Ni—P (nickel-phosphorus) plating using phosphate as a reducing agent, a method that is a combination of these methods with oxide film formation using oxidation treatment, a surface matting method, a method of imparting a moth-eye structure, or other methods. The light shielding member subjected to blackening treatment is preferred to have light shielding performance corresponding to an optical density of 2.0 or more as measured by a Macbeth densitometer.

Figure 6:
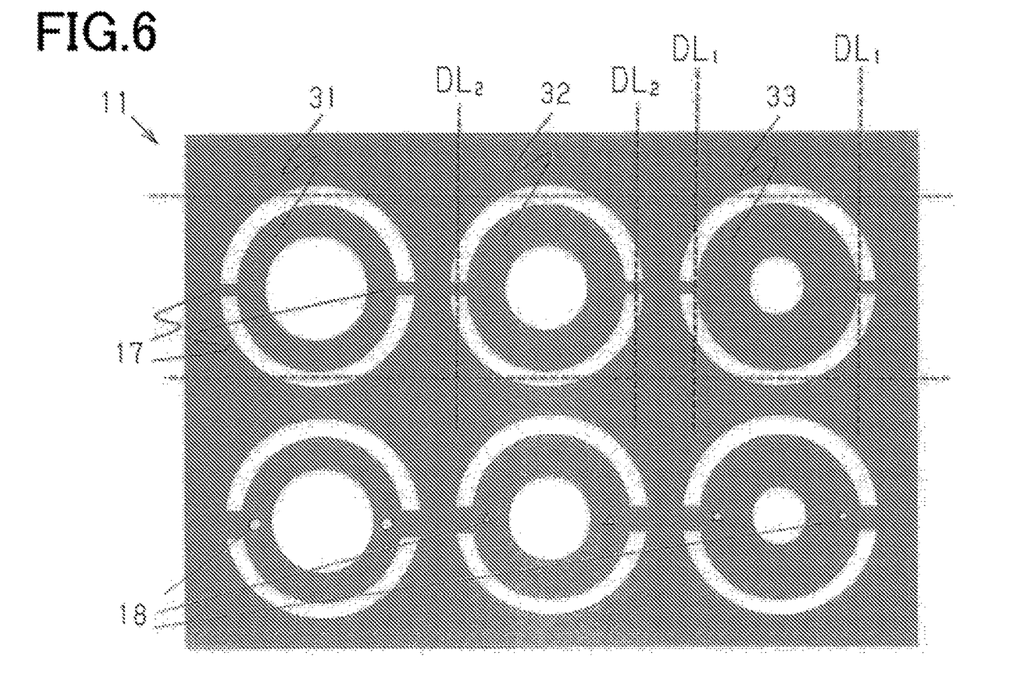
FIG. 6 is a diagram illustrating an example of a scheme of multiple imposition of light shielding members on a major surface of a plate-shaped stainless steel base material.

When forming the light shielding members 31, 32 and 33 using etching, as shown in FIG. 6, a multiple-imposition resist pattern (3-column×2-row as shown) is formed on the major surface of a plate-shaped stainless steel base material 11. This resist pattern is formed according to the light shielding members 31, 32 and 33, as objects to be formed, having different opening (aperture) sizes. The major surface of the base material is etched therethrough into desired shapes so as not to leave bridges 17 holding the light shielding members 31, 32 and 33. After the blackening treatment following etching, the stainless steel base material is diced along dicing lines indicated by the dotted lines in the figure for separation into the light shielding members 31, 32 and 33. Dicing may be performed using a method of mechanically dicing the base material, such as a method using a dicing blade, or may be performed using a laser dicing method. Dicing blades have high dicing speed but may cause deformation and the like of base materials. Laser dicing can minimize deformation of base materials but the dicing speed is inferior to laser dicing.

Dicing lines indicated by DL1 and DL2 in FIG. 6 include not only portions of the stainless steel base material 11 to be cut, but these lines also pass through significant portions of the annular spaces defining the light shielding members 31, 32 and 33 which therefore can advantageously reduce the load imposed on the dicing blade during the dicing process. When the base material is diced along the dicing lines DL1, the light shielding member obtained has an annular configuration as shown in FIG. 3(a) without the bridges 17 remaining. When the base material is diced along the dicing lines DL2, the light shielding member obtained has a configuration as shown in FIG. 3(b) with the bridges 17 remaining at the outer periphery. The profiles of the light shielding members to be obtained using the dicing lines are suitably selected according to the inner wall configuration (presence/absence of guide grooves) and the like of the lens barrel 40 used when configuring the lens unit 50. Laser dicing is advantageous when cutting out light shielding members because it causes no deformation when cutting fine regions, such as the bridges and portions around the bridges. Furthermore, when cutting fine regions, laser dicing can achieve high accuracy compared to the means using a blade, such as a dicing blade, which has an inevitable bulk.

As shown in the lower part of the figure, identification marks 18 or the like can be left on the light shielding members as etched patterns to express the specifications of the light shielding members 31, 32 and 33. This can contribute to eliminating errors when identifying the light shielding members during assembly following dicing, and can assist correct handling of them at the correct disposition positions. In lens units which are mounted to cameras installed in mobile terminals, such as smartphones, the openings (apertures) of the plurality of light shielding members to be incorporated are preferred to have an increased diameter as they are located closer to the image sensor, in order to enlarge the image captured by the image sensor. Therefore, the light shielding members to be disposed at different positions are required to be definitely correctly identified. Even when the light shielding members are of the same type, the opening diameter may be different between the front and rear surfaces. Therefore, identification marks are advantageous when identifying the front and rear.

Second Embodiment

Figure 8:
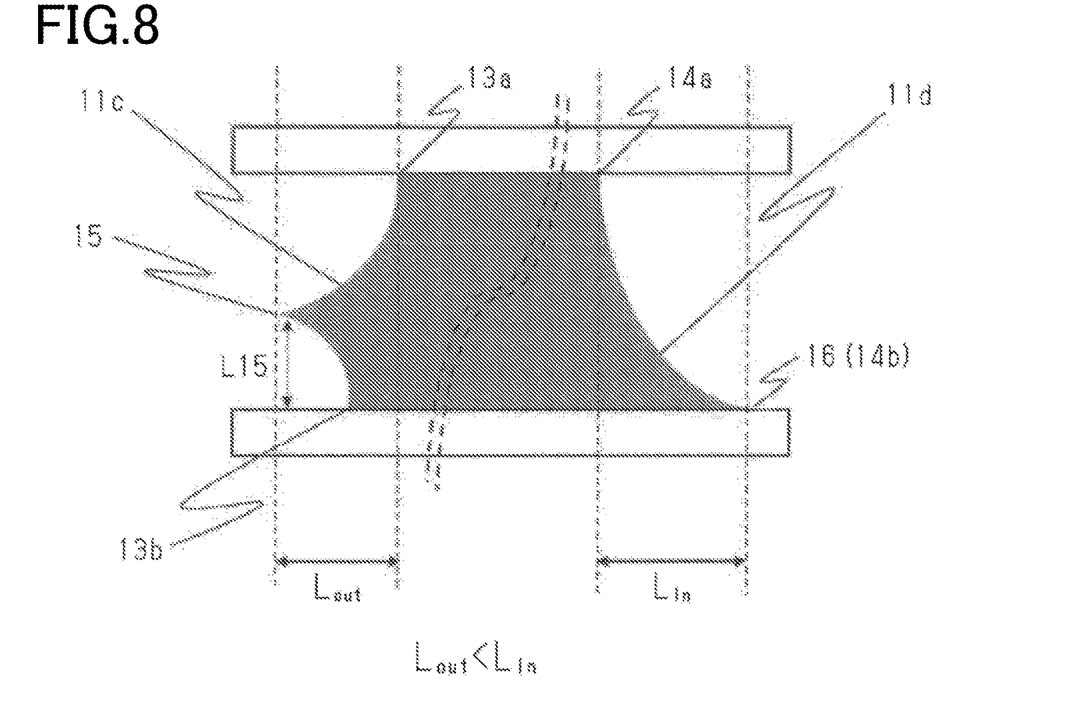
FIG. 8 is a cross-sectional view illustrating the inner periphery and the outer periphery of a light shielding member by bringing their end surfaces closer together, according to a second embodiment.
Figure 9:
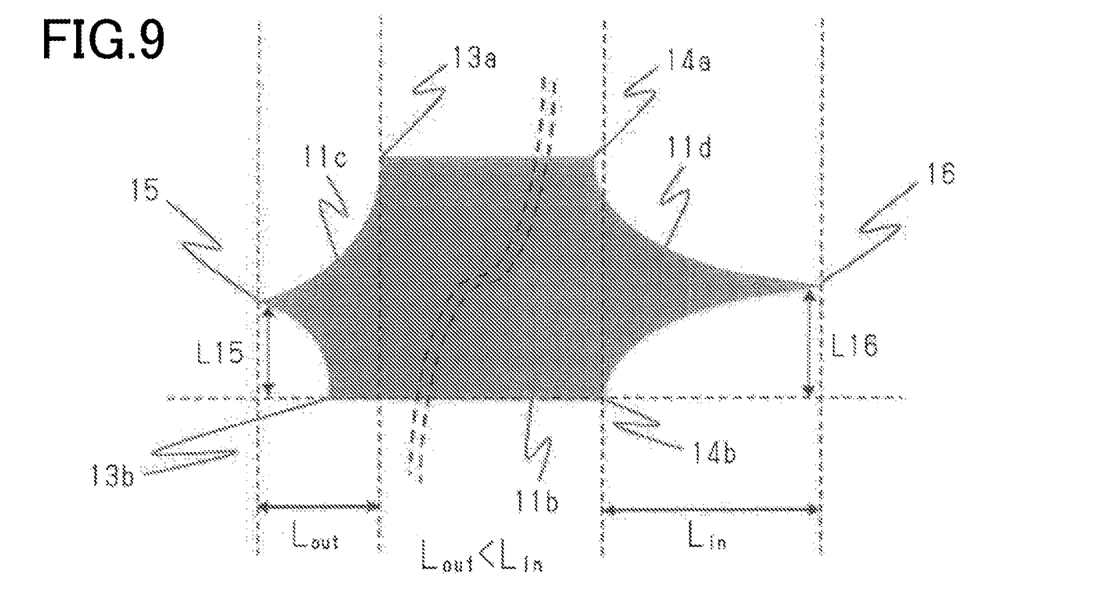
FIG. 9 is a cross-sectional view illustrating the inner periphery and the outer periphery of a light shielding member by bringing their end surfaces closer together, according to a modification of the second embodiment.

Referring to FIGS. 8 and 9, a light shielding member according to a second embodiment will be described. The light shielding member of the second embodiment is different from the light shielding member of the first embodiment in the shapes of the ridge and the edge end. Accordingly, the differences will be described in detail below, and description other than the differences will be omitted.

FIG. 8 is a diagram illustrating end surfaces 11c and 11d of inner and outer peripheries of an annular light shielding member 33. In FIG. 8, these end surfaces are illustrated so as to be close to each other for the sake of convenience in suitably comparing their cross-sectional configurations. The inner periphery of the light shielding member 33 corresponds to the dotted line as an outline of the opening shown in FIG. 3 in which the edge end 16 is continuous. The outer periphery of the light shielding member 33 corresponds to the dash-dot line as an outline of the ring shown in FIG. 3 in which the ridge 15 is continuous.

The opening (aperture) formed in the light shielding member 33 determines the diaphragm of each lens configuring the lens unit and directly influences the optical characteristics and the imaging performance of the lens unit. Therefore, the edge shape of the opening (aperture) is required to be exactly designed. Specifically, the edge end 16 in the inner peripheral surface 11d shown on the right side of FIG. 9 is required to prevent entry of reflected light, which is produced at the edge end 16, into the adjacent lens directly below in the lens unit and to eliminate the influence of noise light wrapping around between the edge end 16 and the lens. Therefore, the edge end 16 is required to have a shape in which the end (sharp end) has an acute angle in the portion (on the lower major surface side) adjacent to the lens located directly below. Therefore, the opening of the light shielding member 33 is preferred to have a diameter on the external-light-incident side larger than that on the opposite side. In other words, in the opening of the light shielding member 33, the diameter in the front surface 11a is preferred to be larger than that in the rear surface 11b.

In contrast, the ridge 15 of the end surface (outer periphery) 11c shown on the left side of FIG. 8 has only a small influence on the optical characteristics and the imaging performance of the lens unit. The cross-sectional configuration of the ridge 15 is designed mainly from the perspective of handleability in the process of assembling the lens unit.

The lens unit 50 shown in FIG. 4 is formed by sequentially placing and laminating the light shielding member 31, the first lens sheet 20, the light shielding member 32, the second lens sheet 22, the light shielding member 33, and the cover glass plate 23 in the lens holder (lens barrel) 40. Alternatively, the lens unit 50 may be formed by covering the structure, which is a laminate of these components in the above order, with the lens barrel 40.

When handling the light shielding members 31, 32 and 33, these members are held by a jig (e.g., tweezers). It is necessary to prevent the jig from contacting the end surface (inner periphery) 11d shown in FIG. 8 serving as an inner wall of the opening (aperture) of the light shielding member and from contacting the edge end 16 thereof having a fine and sharp structure. Otherwise, the opening and the edge end 16 would be damaged. Therefore, portions in the light shielding member 33 to be contacted by the jig should be on the end surface (outer periphery) 11c shown in FIG. 8.

In order to secure mechanical strength in the light shielding member so as not to deform or damage it when it is held by a jig by bringing the jig into contact with two radially opposite ends of the ridge 15 in the circular outer periphery, the end of the ridge 15 may have a steep cylindrical surface with end surfaces (with reduced tapering) forming an angle near 90° as viewed in the figure, instead of an extremely sharp end. Specifically, the outer peripheral surface 11c including the ridge 15 may have a right triangular shape in a cross section perpendicular to the front surface 11a of the light shielding member 33. However, if the ridge 15 is located at an extremely low position as viewed in the figure, the contact portions with the jig may also be located at a low position. Therefore, the lens directly below the light shielding member may have a risk of being in contact with the jig holding the light shielding member, in the process of assembling the lens unit. For this reason, the ridge 15 is preferred to be located at a position suitably away from the lower major surface 11b of the light shielding member in the thickness direction. Specifically, a distance L15 between the rear surface 11b and the ridge 15 is preferred to be a length with which the light shielding member can be held using a jig.

It is required that a length Lout shown in FIG. 8 by which the ridge 15 (outer peripheral side) protrudes outward in the in-plane direction of the light shielding member is configured to be shorter than a length Lin by which the edge end 16 (inner peripheral side) protrudes toward the center of the opening. If Lout is a length from a front end 13a (upper side) of a major surface of the light shielding member, which is larger than the length from an end (rear end) 13b (lower side) of the other major surface, Lout is preferred to be shorter than Lin. If the light shielding member has a cross-sectional configuration in which Lout is as small as possible, the ridge 15 can be prevented from being damaged by being in contact with the inner wall surface of the lens barrel configuring the lens unit.

The projection length Lout of the ridge 15 corresponds to a distance between the ridge 15 and the portion where the front surface 11a of the light shielding member 33 is connected to the end surface 11c including the ridge 15 in a cross section that is parallel to a plane perpendicular to the front surface 11a, that is, a distance along the radial direction of the light shielding member 33. The projection length Lin of the edge end 16 corresponds to a distance between the opening in the front surface 11a and the opening in the rear surface 11b in a cross section that is parallel to a plane perpendicular to the front surface 11a, that is, a distance along the radial direction of the light shielding member 33. The projection length Lin of the edge end 16 corresponds to a distance between the front end 14a and the rear end 14b in a cross section that is parallel to a plane perpendicular to the front surface 11a, that is, a distance along the radial direction of the light shielding member 33.

If the projection length Lout of the ridge 15 is smaller than the projection length Lin of the edge end 16, mechanical strength of the ridge 15 can be prevented from being reduced compared to the case where the projection length Lout of the ridge 15 is equal to or more than the projection length Lin of the edge end 16. Thus, handleability of the light shielding member 33 can be enhanced when it is held with a jig.

When the diameters of the opening (aperture) in the front and rear surfaces, the shapes of the ridges in the outer and inner peripheral surfaces 11c and 11d, and the projection lengths of the ridges satisfy the relationship described above, the design of the light shielding member can be changed, for example, to have a cross-sectional configuration as shown in FIG. 9. Specifically, the edge end 16 may be apart from the lower major surface (rear surface) 11b of the light shielding member in the thickness direction by a length equal to or more than that of the ridge 15. A distance L16 between the rear surface 11b and the edge end 16 may be equal to or different from the distance L15 between the rear surface 11b and the ridge 15.

[Modifications]

The embodiments described above can be modified and implemented as follows.

[Outer Peripheral Surface]

The outer peripheral surface 11c may have a triangular shape projected outward in the radial direction of the light shielding member 33 in a cross section that is parallel to a plane perpendicular to the front surface 11a. Specifically, in the outer peripheral surface 11c, the portion connecting between the front surface 11a and the ridge 15 may be linearly formed and the portion connecting between the rear surface 11b and the ridge 15 may be linearly formed. In this case as well, the outer peripheral surface 11c having the ridge 15 can contribute to enhancing handleability of the light shielding member 33.

[Light Shielding Member]

The structure of the light shielding member 33 of the first embodiment may be implemented being combined with the structure of the light shielding member 33 of the second embodiment. Specifically, the light shielding member 33 may have a structure satisfying both of the relationship between the thicknesses tout and tin and the relationship between the lengths Lout and Lin described above.

REFERENCE SIGNS LIST

11 . . . Stainless steel base material; 11a . . . Major surface (front surface); 11b . . . Major surface (rear surface); 11c . . . End surface (outer peripheral surface); 11d . . . End surface (inner peripheral surface); 12a, 12b . . . Resist pattern; 15 . . . Ridge; 16 . . . Edge end; 23 . . . Cover glass plate; 40 . . . Lens holder (lens barrel); 15 . . . Lens unit; 20 . . . First lens sheet; 20a, 20b, 22a, 22b . . . Lens; 22 . . . Second lens sheet; 31, 32, 33 . . . Light shielding member; 100 . . . Camera module.

What is claimed is:

1. A light shielding member formed of an annular metal base material, comprising:
   a front surface;
   a rear surface facing away from the front surface; and
   an outer peripheral surface connecting between the front surface and the rear surface, in an outer periphery of the light shielding member, wherein
   the outer peripheral surface includes a ridge that is protruded outward furthest therein in a radial direction of the light shielding member, in a cross section that is parallel to a plane perpendicular to the front surface, wherein external light is incident on the front surface of the light shielding member;
   the light shielding member includes an opening penetrating the metal base material in a thickness direction thereof;
   the opening is enclosed by an inner peripheral surface;
   the inner peripheral surface has a tapered shape in which an opening diameter in the front surface is larger than an opening diameter in the rear surface;
   when the light shielding member is imaged in the radial direction thereof by bringing the ridge into focus under an imaging condition of a depth of field being 0.4 µm, a portion having a first thickness including the ridge is focused in the light shielding member in the thickness direction;
   when the light shielding member is imaged in the radial direction thereof by bringing an edge end of the opening into focus under the imaging condition of a depth of field being 0.4 µm a portion having a second thickness including the edge end is focused in the light shielding member in the thickness direction; and
   the first thickness is larger than the second thickness.

2. The light shielding member of claim 1, wherein the ridge is located at a position deviated from a center portion of the metal base material in a thickness direction thereof.

3. The light shielding member of claim 1, wherein the ridge is located at a position closer to the rear surface in the thickness direction of the metal base material.

4. The light shielding member of claim 1, wherein a length by which the ridge protrudes outward in an in-plane direction of the light shielding member is smaller than a length by which the edge end protrudes toward a center of the opening.

5. The light shielding member of claim 1, wherein the metal base material is any one material selected from a group consisting of aluminum, iron, copper, chromium, nickel, cobalt, and alloys of these materials.

6. The light shielding member of claim 5, wherein the metal base material is an iron-nickel alloy or an iron-nickel-cobalt alloy.

7. The light shielding member of claim 6, wherein the metal base material is Invar or Super Invar.

8. A lens unit, comprising:
   the light shielding member of claim 1;
   a plurality of lenses; and
   a lens holder.

9. A camera module, comprising:
   the lens unit of claim 8; and
   an image sensor.

10. An electronic device, comprising the camera module of claim 9.

* * * * *